US009968012B2

(12) United States Patent
Terasaki et al.

(10) Patent No.: US 9,968,012 B2
(45) Date of Patent: May 8, 2018

(54) HEAT-SINK-ATTACHED POWER MODULE SUBSTRATE, HEAT-SINK-ATTACHED POWER MODULE, AND METHOD FOR PRODUCING HEAT-SINK-ATTACHED POWER MODULE SUBSTRATE

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP); Yoshirou Kuromitsu, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days. days.

(21) Appl. No.: 14/435,554

(22) PCT Filed: Oct. 11, 2013

(86) PCT No.: PCT/JP2013/077766
§ 371 (c)(1),
(2) Date: Apr. 14, 2015

(87) PCT Pub. No.: WO2014/061588
PCT Pub. Date: Apr. 24, 2014

(65) Prior Publication Data
US 2015/0282379 A1    Oct. 1, 2015

(30) Foreign Application Priority Data
Oct. 16, 2012   (JP) .................................. 2012-228870

(51) Int. Cl.
*H05K 7/20*    (2006.01)
*H01L 21/48*   (2006.01)
(Continued)

(52) U.S. Cl.
CPC ......... *H05K 7/209* (2013.01); *H01L 21/4882* (2013.01); *H01L 23/3735* (2013.01);
(Continued)

(58) Field of Classification Search
CPC ... H05K 7/20; H05K 1/00; F28F 13/00; F28F 7/00; G06F 1/20; B21D 53/02;
(Continued)

(56) References Cited

U.S. PATENT DOCUMENTS 6,033,787 A * 3/2000 Nagase .................. B32B 15/04
228/121
6,124,635 A * 9/2000 Kuwabara ........... H01L 23/3733
257/703

(Continued)

FOREIGN PATENT DOCUMENTS

CN       101947689 A    1/2011
DE    102010041714 A1   8/2011
(Continued)

OTHER PUBLICATIONS

English Translation of the Japan Patent 200264169A.*
(Continued)

*Primary Examiner* — Anatoly Vortman
(74) *Attorney, Agent, or Firm* — Locke Lord LLP

(57) ABSTRACT

A heat-sink-attached-power module substrate (1) has a configuration such that either one of a metal layer (13) and a heat sink (31) is composed of aluminum or an aluminum alloy, and the other one of them is composed of copper or a copper alloy, the metal layer (13) and the heat sink (31) are bonded together by solid phase diffusion bonding, an intermetallic compound layer formed of copper and aluminum is formed in a bonding interface between the metal layer (13) and the heat sink (31), and an oxide is dispersed in an interface between the intermetallic compound layer and (Continued)

either one of the metal layer (13) composed of copper or a copper alloy and heat sink (31) composed of copper or a copper alloy in a layered form along the interface.

8 Claims, 8 Drawing Sheets

(51) Int. Cl.
    *H01L 23/373*     (2006.01)
    *H01L 23/473*     (2006.01)
    *H01L 23/00*     (2006.01)

(52) U.S. Cl.
    CPC ............ *H01L 23/473* (2013.01); *H01L 24/29* (2013.01); *H01L 24/32* (2013.01); *H01L 2224/29111* (2013.01); *H01L 2224/32227* (2013.01); *H01L 2224/83424* (2013.01); *H01L 2924/13055* (2013.01)

(58) Field of Classification Search
    CPC . F28D 15/00; H01L 23/3733; H01L 23/3735; H01L 23/142; H01L 21/4871; B32B 3/00; B32B 15/01
    USPC ..... 361/679.46, 679.54, 698, 699, 704, 705, 361/707, 708, 710, 712, 715, 719, 720, 361/361, 165, 174, 257, 454; 165/80.2, 165/80.3, 80.4, 80.5, 104.33, 185; 174/250, 252, 258, 260; 257/706–727; 428/208–213, 545, 652, 660, 675, 679; 29/592.1, 740, 741, 759, 832, 890.03, 29/890.039
    See application file for complete search history.

(56) References Cited

U.S. PATENT DOCUMENTS

| | | | | |
|---|---|---|---|---|
| 6,310,775 B1 * | 10/2001 | Nagatomo | .......... | H01L 23/3735 165/185 |
| 6,323,458 B1 | 11/2001 | Nomura et al. | | |
| 6,921,583 B2 | 7/2005 | Koyama et al. | | |
| 7,532,481 B2 * | 5/2009 | Nagase | ............... | H01L 23/3735 361/706 |
| 8,116,084 B2 * | 2/2012 | Kitahara | ............... | B23K 1/0008 174/252 |
| 8,159,821 B2 * | 4/2012 | Tan | ........................ | B23K 20/02 165/104.33 |
| 8,883,318 B2 * | 11/2014 | Yamamoto | ............... | B23K 1/19 428/652 |
| 2002/0109152 A1 * | 8/2002 | Kobayashi | .......... | H01L 23/3735 257/177 |
| 2006/0046035 A1 * | 3/2006 | Tanaka | ................ | H01L 21/4871 428/209 |
| 2009/0174063 A1 * | 7/2009 | Furukawa | ........... | H01L 23/3735 257/703 |
| 2010/0243458 A1 | 9/2010 | Kojima et al. | | |
| 2012/0202090 A1 * | 8/2012 | Yamamoto | ............... | B23K 1/19 428/651 |
| 2012/0298408 A1 * | 11/2012 | Nagatomo | ............. | H01L 23/142 174/260 |
| 2013/0010429 A1 | 1/2013 | Tonomura et al. | | |
| 2013/0071686 A1 | 3/2013 | Oda et al. | | |

FOREIGN PATENT DOCUMENTS

| | | | | |
|---|---|---|---|---|
| EP | 2833398 A1 | 2/2015 | | |
| JP | 04-315524 A | 11/1992 | | |
| JP | 06-292984 A | 10/1994 | | |
| JP | 8-255973 A | 10/1996 | | |
| JP | 11-156995 A | 6/1999 | | |
| JP | 2001-252772 A | 9/2001 | | |
| JP | 2002-064169 A | 2/2002 | | |
| JP | 2002-231865 A | 8/2002 | | |
| JP | 2003-078086 A | 3/2003 | | |
| JP | 2003-092383 A | 3/2003 | | |
| JP | 2003-258170 A | 9/2003 | | |
| JP | 2004-001069 A | 1/2004 | | |
| JP | 2004-288828 A | 10/2004 | | |
| JP | 2009135392 A * | 6/2009 | ............ | H01L 23/36 |
| JP | 2009-224571 A | 10/2009 | | |
| JP | 2010-034238 A | 2/2010 | | |
| JP | 2010-137251 A | 6/2010 | | |
| JP | 2012-160642 A | 8/2012 | | |
| TW | 252061 B | 7/1995 | | |
| TW | 540298 B | 7/2003 | | |
| WO | WO 2011030754 A1 * | 3/2011 | | |
| WO | 2011/155379 A1 | 12/2011 | | |
| WO | WO-2011/155379 A1 | 12/2011 | | |
| WO | 2013/147144 A1 | 10/2013 | | |
| WO | 2014/046130 A1 | 3/2014 | | |

OTHER PUBLICATIONS

International Search Report mailed Dec. 17, 2013, issued for PCT/JP2013/077766 and English translation thereof.
Office Action mailed May 20, 2014, issued for the Japanese patent application No. 2013-214070 and English translation thereof.
Notice of Allowance mailed Aug. 12, 2014, issued for the Japanese patent application No. 2013-214070 and English translation thereof.
Search Report mailed May 20, 2016, issued for the European patent application No. 13847976.1.
Uehara, "Fabrication of intermetallics micro networks on light metals for surface stress modifications through reaction diffusion joining," Oct. 16-20, 2011, Material Science and Technology (MS&T) 2011 Conference, 1539-1545.
Ujimoto, machine translation of JPH06-292984, dated Oct. 21, 1994.
Supplementary European Search Report dated May 9, 2016, issued for the European patent application No. 13839672.6.
Office Action dated May 26, 2016, issued for the Chinese patent application No. 201380048500.6 and English translation of Search Report.
Office Action dated Aug. 2, 2016, issued for Taiwanese patent application No. 102133870 and English translation of Search Report.
International Search Report dated Nov. 19, 2013, issued for PCT/JP2013/075158 and English translation thereof.
Notice of Allowance dated Apr. 25, 2014, issued for the Japanese patent application No. 2013-193431 and English translation thereof.
Office Action dated Mar. 22, 2017, issued for U.S. Appl. No. 14/428,776.
Office Action dated Sep. 8, 2017, issued for U.S. Appl. No. 14/428,776.

* cited by examiner

HEAT-SINK-ATTACHED POWER MODULE SUBSTRATE, HEAT-SINK-ATTACHED POWER MODULE, AND METHOD FOR PRODUCING HEAT-SINK-ATTACHED POWER MODULE SUBSTRATE

TECHNICAL FIELD

The present invention relates to: a heat-sink-attached-power module substrate including a power module substrate in which a circuit layer is arranged on one surface of an insulation layer (ceramic substrate) and a metal layer is arranged on the other surface of the insulation layer, and a heat sink is bonded on the power module substrate; a heat-sink-attached-power module in which a semiconductor device is mounted on the heat-sink-attached-power module substrate; and a producing method of the heat-sink-attached-power module substrate.

Priority is claimed on Japanese Patent Application No. 2012-228870 filed Oct. 16, 2012, the contents of which are incorporated herein by reference.

BACKGROUND ART

Among various semiconductor devices, power devices for high-power control that are used to control electric vehicles, electric automobiles and the like, generate a large amount of heat. Thus, as a substrate mounting such power devices, a power module substrate in which a metal plate having excellent conductivity and served as a circuit layer and metal layer is bonded on both surfaces of a ceramic substrate (insulation layer) composed of for example AlN (aluminum nitride) or the like, is conventionally widely used.

A semiconductor device as a power device (electronic component) is mounted on the circuit layer of such power module substrate via a solder material, and a power module is produced. In addition, a heat sink is bonded under the metal layer, and it has a structure in which the heat is allowed to be dissipated.

Conventionally, as a method for bonding a power module substrate and a heat sink together, for example, as shown in Patent Document 1, a method in which grease is interposed between a metal layer of a power module and a heat sink and they are clamped with screw is disclosed. Also, as shown in Patent Document 2, a method in which a metal layer of a power module substrate and a heat sink is bonded together via a solder is disclosed.

PRIOR ART DOCUMENTS

Patent Documents

[Patent Document 1] Japanese Unexamined Patent Application, First Publication No. 2004-288828
[Patent Document 2] Japanese Unexamined Patent Application, First Publication No. 2009-224571

DISCLOSURE OF THE INVENTION

Problems to be Solved by the Invention

As shown in Patent Document 1 and 2, when the metal layer and the heat sink are bonded together via a grease or solder, the temperature increases due to the insufficient dissipation of the heat generated from electronic components (semiconductor device) in a bonding portion of the metal layer and heat sink because the thermal resistance of the grease and solder is higher than that of the metal layer and heat sink, and thereby there is a possibility in that the functionality of the electronic components reduces. In particular, in a case where a grease is utilized, there is a case such that the grease is deteriorated or a gap inside the grease is generated when the heat cycle and power cycle are performed, and therefore, there is a problem in that the thermal resistance further increases in the bonding portion. Accordingly, when the electronic components are used, there is a need for that the thermal resistance in the bonding portion between the metal layer and heat sink is reduced and the heat generated from the electronic components is sufficiently dissipated.

The present invention has been made in view of the above circumstances, and the purpose thereof is to provide: a heat-sink-attached-power module substrate in which the thermal resistance in the bonding portion of the metal layer and heat sink is reduced and the temperature increase of the electronic components can be suppressed, in a case where either one of a metal layer and heat sink, which will be bonded together, is composed of aluminum or an aluminum alloy, and the other one of them is composed of copper or a copper alloy; a heat-sink-attached-power module; and a producing method of the heat-sink-attached-power module substrate.

Means for Solving the Problem (1) A heat-sink-attached-power module substrate according to an aspect of the present invention includes:

a power module substrate in which a circuit layer is arranged on one surface of an insulation layer and a metal layer is arranged on the other surface of the insulation layer; and a heat sink bonded on the metal layer of the power module substrate, wherein either one of the metal layer and the heat sink is composed of aluminum or an aluminum alloy, and the other one of them is composed of copper or a copper alloy, the metal layer and the heat sink are bonded together by solid phase diffusion bonding, an intermetallic compound layer formed of copper and aluminum is formed in a bonding interface between the metal layer and the heat sink, and an oxide is dispersed in an interface between the intermetallic compound layer and either one of the metal layer composed of copper or a copper alloy and heat sink composed of copper or a copper alloy in a layered form along the interface.

According to the above-described heat-sink-attached-power module substrate, since either one of the metal layer and heat sink is composed of aluminum or an aluminum alloy and the other one of them is composed of copper or a copper alloy, and these metal layer and heat sink are bonded together by solid phase diffusion bonding, the thermal resistance in a bonding interface between the metal layer and the heat sink can be reduced as compared with the case of bonding via grease or solder.

In a case where the metal layer and heat sink are firmly bonded together by solid phase diffusion bonding and the heat cycle is performed thereto, an occurrence of peeling of the interface between the metal layer and heat sink is suppressed, and the bonding reliability of the bonding portion of the metal layer and heat sink can be improved.

Since the metal layer and heat sink are bonded together by solid phase diffusion bonding, a gap is less likely to be generated in the bonding portion of the metal layer and heat sink, a good thermal conductivity of the bonding portion is obtained, and the thermal resistance can be lowered.

When they are bonded together by maintaining at the temperature less than the eutectic temperature of said either aluminum or aluminum alloy and said either copper or copper alloy and performing solid phase diffusion bonding, a liquid phase is not formed between the metal layer and the heat sink. Therefore, a large amount of compounds of aluminum and copper is not generated between the metal layer and the heat sink, and the bonding reliability of the bonding portion of the metal layer and heat sink can be improved.

When the metal layer composed of aluminum or an aluminum alloy, each of which has a low deformation resistance, is arranged on the other surface of the insulation layer, the occurrence of cracks in the insulation layer can be suppressed when the heat cycle is performed thereto, because the metal layer absorbs the thermal stress generated due to the difference in thermal expansion coefficient between the insulation layer and heat sink.

When the metal layer composed of copper or a copper alloy, each of which has a good thermal conductivity, is arranged on the other surface, the heat generated from a semiconductor device can be efficiently transferred to the heat sink side.

Since the heat sink is composed of either of: copper or a copper alloy, each of which has a good thermal conductivity; and aluminum or an aluminum alloy, heat dissipation properties of the heat-sink-attached-power module substrate can be improved.

Since the intermetallic compound layer formed of Cu and Al is formed in the bonding interface between the metal layer and the heat sink, the interdiffusion of Al (aluminum atom) in either the metal layer or heat sink and Cu (copper atom) in either the heat sink and metal layer are sufficiently carried out, and the metal layer and heat sink are firmly bonded together.

In the bonding interface between the intermetallic compound layer and either: the copper layer composed of copper or a copper alloy; or heat sink composed of copper or a copper alloy, since the oxide is dispersed in a layered form along the bonding interface, an oxide film formed on the surface of either: the metal layer composed of aluminum or an aluminum alloy; or heat sink composed of aluminum or an aluminum alloy, is broken and solid phase diffusion bonding progresses sufficiently.

The intermetallic compound layer preferably has a structure in which a plurality of intermetallic compounds is laminated along the bonding interface between the metal layer and the heat sink. In this case, the intermetallic compounds which are brittle are prevented from growing large. Also, since the intermetallic compounds are formed in a layered form so as to be suitable for each composition from the metal layer toward the heat sink by the interdiffusion of Al in the metal layer or heat sink and Cu in the heat sink or metal layer, the properties of the area in the vicinity of the bonding interface can be stable.

Specifically, since three types of the intermetallic compounds, which are a $\theta$ phase, a $\eta2$ phase, and a $\zeta2$ phase, are laminated in the intermetallic compound layer, the volume change inside the intermetallic compound layer becomes small, and an internal distortion thereof is suppressed.

Here, it is preferable that the average crystal grain size of either: the copper layer composed of copper or a copper alloy; or heat sink composed of copper or a copper alloy, is in the range of 50 μm to 200 μm, and the average crystal grain size of either: the metal layer composed of aluminum or an aluminum alloy; or heat sink composed of aluminum or an aluminum alloy, is 500 μm or more. In this case, since the average crystal grain sizes of the metal layer and heat sink are set relatively large, an unnecessary distortion is not accumulated in the metal layer and heat sink, and good fatigue characteristics are obtained. Therefore, in the heat cycle load, the bonding reliability with respect to the thermal stress generated between the power module substrate and the heat sink is improved.

(2) A heat-sink-attached-power module according to another aspect of the present invention includes: the heat-sink-attached-power module substrate described in (1), and a semiconductor device bonded to one side of the circuit layer.

According to the above-described heat-sink-attached-power module, since the thermal stress in the bonding interface between the metal layer and the heat sink is low, the heat from the semiconductor device can be efficiently transferred to the heat sink side. In addition, since the heat sink is composed of either: copper or a copper alloy, each of which has a good thermal conductivity; or aluminum or an aluminum alloy, the thermal dissipation properties of the heat-sink-attached-power module substrate can be improved. Accordingly, an increase in temperature of the semiconductor device is suppressed, the semiconductor device can be operated at a predetermined temperature, and the stability of the operation thereof can be improved.

When the metal layer composed of aluminum or an aluminum alloy, each of which has a low deformation resistance, is arranged on the other surface of the insulation layer, the occurrence of cracks in the insulation layer can be suppressed, and the reliability of the heat-sink-attached-power module can be improved.

When the metal layer is composed of copper or a copper alloy, each of which has a good thermal conductivity, the heat generated from the semiconductor device can be more efficiently transferred toward the heat sink side. Also, an increase in temperature of the semiconductor device is suppressed, the semiconductor device can be operated at a predetermined temperature, and the stability of the operation thereof can be improved.

(3) A producing method of a heat-sink-attached-power module substrate according to still another aspect of the present invention, the heat-sink-attached-power module substrate including a circuit layer being arranged on one surface of an insulation layer, and a metal layer being arranged on the other surface of the insulation layer, and a heat sink bonded on the metal layer of the power module substrate, the producing method includes the steps of:

composing either one of the metal layer and the heat sink of aluminum or an aluminum alloy, and composing the other one of them of copper or a copper alloy, bonding the metal layer and the heat sink together by solid phase diffusion bonding, forming an intermetallic compound layer formed of copper and aluminum in a bonding interface between the metal layer and the heat sink, and dispersing an oxide in an interface between the intermetallic compound layer and either one of the metal layer composed of copper or a copper alloy and heat sink composed of copper or a copper alloy in a layered form along the interface.

According to the above-described heat-sink-attached-power module substrate, since either one of the metal layer and heat sink is composed of aluminum or an aluminum alloy and the other one of them is composed of copper or a copper alloy, and these metal layer and heat sink are bonded together by solid phase diffusion bonding, a heat-sink-attached power module substrate having a low thermal resistance in a bonding interface between the metal layer and the heat sink as compared with the case of bonding via grease or solder can be obtained.

In addition, as described above, since the intermetallic compound layer formed of Cu and Al is formed in the bonding interface between the metal layer and the heat sink, and oxide is dispersed in a layered form in the interface between the intermetallic compound layer and the metal layer or heat sink, a heat-sink-attached-power module substrate in which the metal layer and heat sink are firmly bonded together can be obtained.

Effects of the Invention

The present invention can provide: a heat-sink-attached-power module substrate in which the thermal resistance in the bonding portion of the metal layer and heat sink is reduced and the temperature increase of the electronic components can be suppressed, in a case where either one of a metal layer and heat sink, which will be bonded together, is composed of aluminum or an aluminum alloy and the other one of them is composed of copper or a copper alloy; a heat-sink-attached-power module; and a producing method of the heat-sink-attached-power module substrate.

EMBODIMENTS OF THE INVENTION

First Embodiment

An embodiment of the present invention will be explained below with reference to the accompanying drawings.

Figure 1:
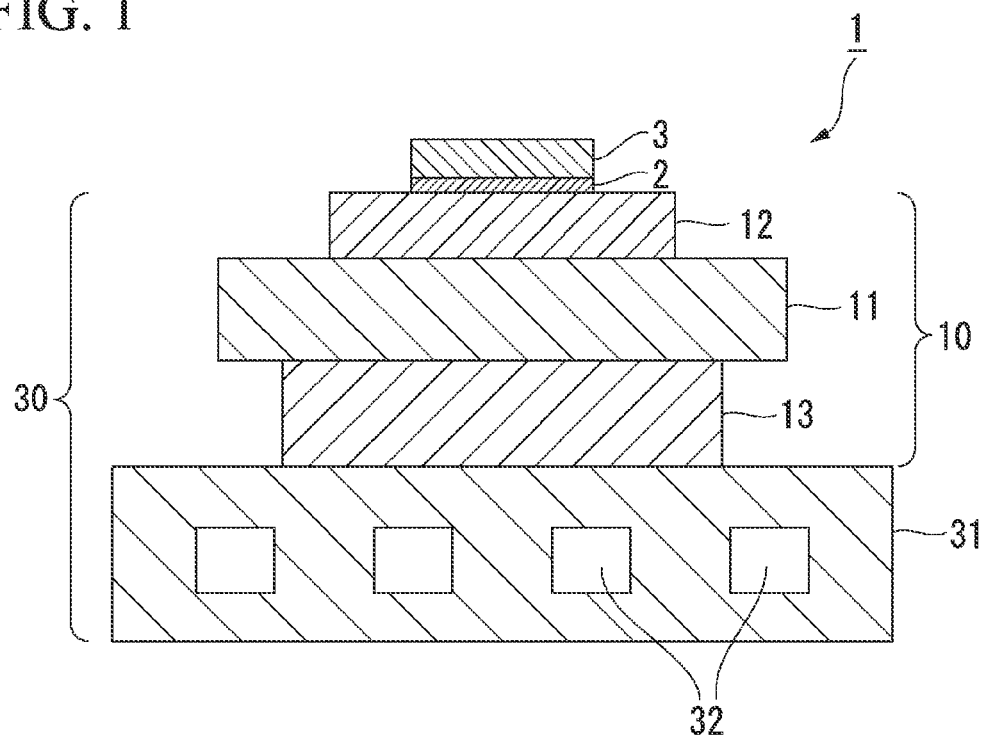
FIG. 1 shows a schematic explanatory diagram of a heat-sink-attached-power module, a heat-sink-attached-power module substrate, and a power module substrate according to a first embodiment of the present invention.

FIG. 1 shows a heat-sink-attached-power module substrate 1, a heat-sink-attached-power module substrate 30, and a power module substrate 10 according to a first embodiment of the present invention.

The heat-sink-attached-power module 1 includes the heat-sink-attached-power module substrate 30, and a semiconductor device 3 bonded to one side (upper side in FIG. 1) of the heat-sink-attached-power module substrate 30 via a solder layer 2.

The solder layer 2 is, for example, Sn—Ag-based, Sn—Cu-based, Sn—In-based, or Sn—Ag—Cu-based solder materials (so-called, lead-free solder material), and it bonds the heat-sink-attached-power module substrate 30 and a semiconductor device 3 together.

The semiconductor device 3 is electronic components including a semiconductor, and various semiconductor devices are selected depending on the functionality required. An IGBT device is used in the present embodiment.

The heat-sink-attached-power module substrate 30 includes the power module substrate 10 and a heat sink 31 bonded to the other side (lower side in FIG. 1) of the power module substrate 10.

As shown in FIG. 1, the power module substrate 10 includes: a ceramic substrate 11 (insulation layer), a circuit layer 12 formed on one surface (a first surface and upper surface in FIG. 1) of the ceramic substrate 11, and a metal layer 13 formed on the other surface (a second surface and lower surface in FIG. 1) of the ceramic substrate 11.

The ceramic substrate 11 is for preventing electric connection between the circuit layer 12 and the metal layer 13, and is composed of AlN (aluminum nitride) having high insulation properties. The thickness of the ceramic substrate 11 is set to 0.2 to 1.5 mm, and the thickness thereof in the present embodiment is set to 0.635 mm.

The circuit layer 12 is formed by bonding a metal plate on the first surface (upper surface in FIG. 1) of the ceramic substrate 11. In the present embodiment, the circuit layer 12 is formed by bonding an aluminum plate 22 made of an aluminum rolled sheet having a purity of 99.99% by mass or more (so-called 4N aluminum) to the ceramic substrate 11.

The metal layer 13 is formed by bonding a metal plate on the second surface (lower surface in FIG. 1) of the ceramic substrate 11. In the present embodiment, the metal layer 13 is formed by bonding an aluminum plate 23 made of a rolled sheet of aluminum having a purity of 99.99% or more (so-called 4N aluminum) to the ceramic substrate 11. In the first embodiment, the average crystal grain size of the metal layer 13 is 500 μm or more.

A heat sink 31 dissipates the heat of the power module substrate 10 side. The heat sink 31 is composed of copper or a copper alloy having a good thermal conductivity, and in the present embodiment, it is composed of an oxygen-free copper. Furthermore, in the first embodiment, the average crystal grain size of the heat sink 31 is in the range of 50 to 200 μm.

Inside the heat sink 31, a flow path 32 through which a fluid for cooling flows is provided.

In addition, in the present embodiment, the metal layer 13 of the power module substrate 10 and the heat sink 31 are bonded together by solid phase diffusion bonding.

Figure 2:
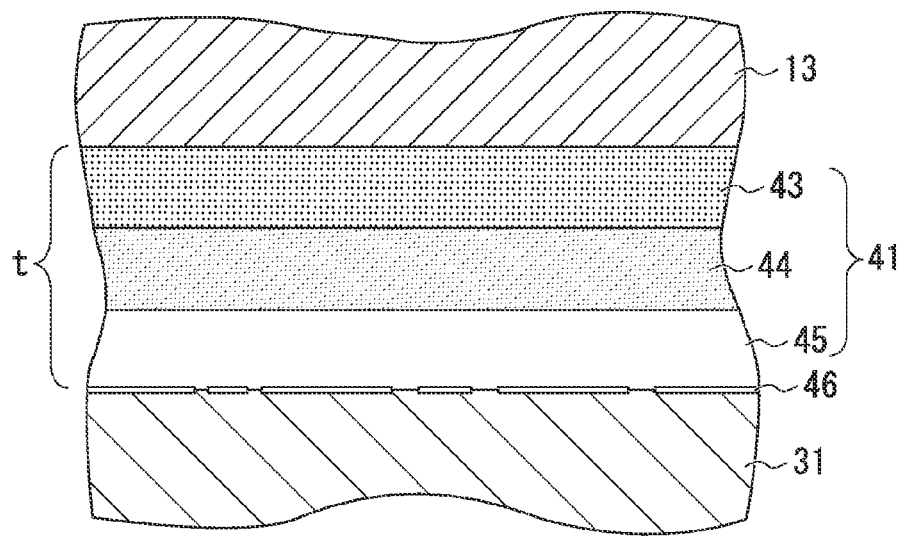
FIG. 2 shows an enlarged view of a bonding portion of a metal layer and heat sink in FIG. 1.

As shown in FIG. 2, in a bonding interface between the metal layer 13 and the heat sink 31, an intermetallic compound layer 41 is formed.

The intermetallic compound layer 41 is formed by the interdiffusion of Al (aluminum atom) of the metal layer 13 and Cu (copper atom) of the heat sink 31. This intermetallic compound layer 41 has a concentration gradient in which the concentration of aluminum lowers gradually and the concentration of copper increases gradually toward the heat sink 31 from the metal layer 13.

The intermetallic compound layer 41 is formed of intermetallic compounds including Al and Cu, and in the present embodiment, it has a structure in which a plurality of intermetallic compounds is laminated along the bonding interface. Here, the thickness t of intermetallic compound layer 41 is set to be in the range of 1 to 80 μm, and preferably be in the range of 5 to 80 μm.

Figure 13:
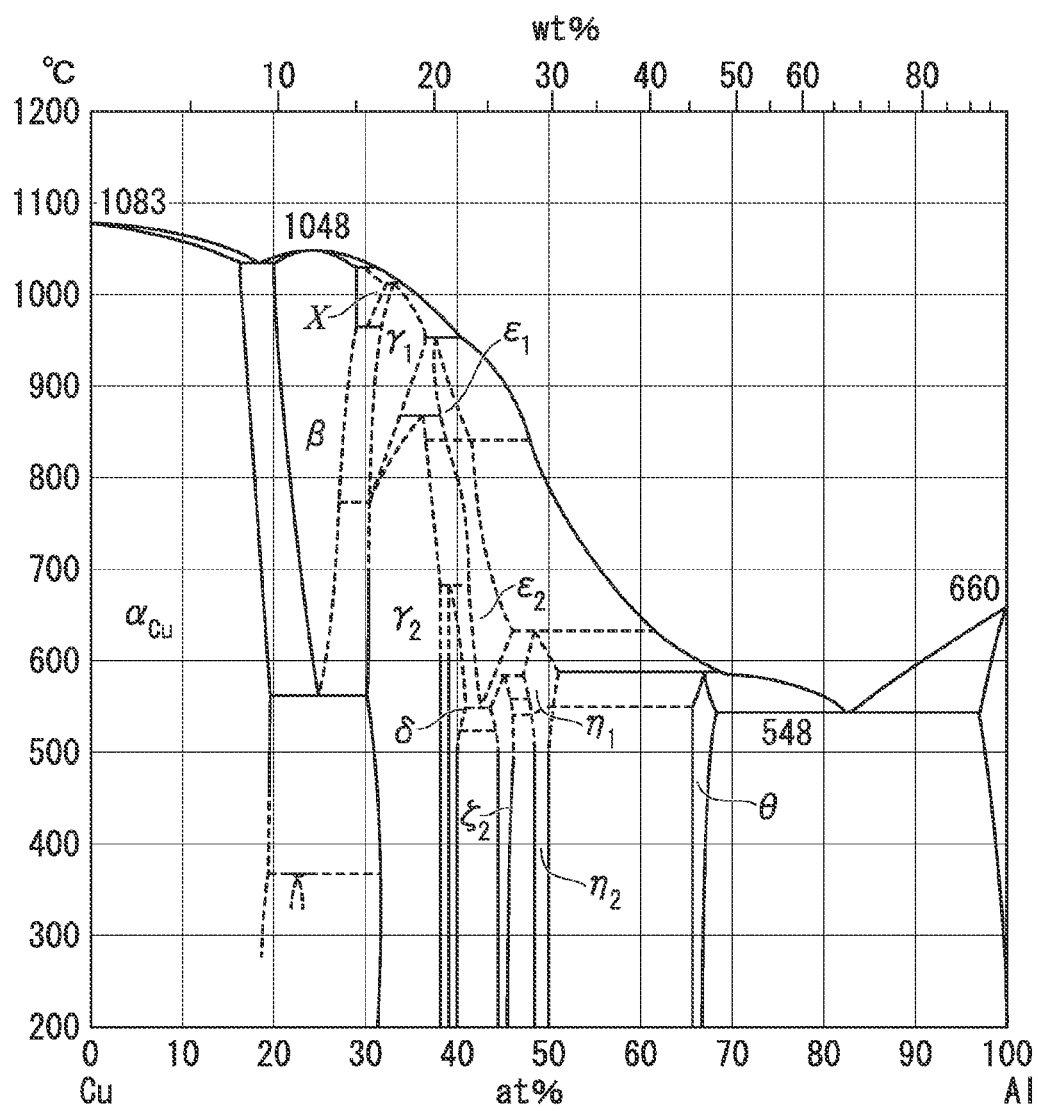
FIG. 13 is a binary phase diagram of Cu and Al.

In the first embodiment, as shown in FIG. 2, it has a structure in which three types of the intermetallic compounds are laminated, and a θ phase 43, a η2 phase 44, and a ζ2 phase 45 are arranged sequentially from the metal layer 13 toward the heat sink 31 (see FIG. 13).

In the bonding interface between the intermetallic compound layer 41 and the heat sink 31, an oxide 46 is dispersed in a layered form along the bonding interface. In addition, in the first embodiment, the oxide 46 is an aluminum oxide such as alumina ($Al_2O_3$). In addition, the oxide 46 is dispersed in a state of being divided in the interface between the intermetallic compound layer 41 and the heat sink 31, and the intermetallic compound layer 41 and the heat sink 31 are directly in contact in some regions.

Next, a producing method of the heat-sink-attached-power module 1, the heat-sink-attached-power module substrate 30, and the power module substrate 10 according to the present embodiment will be explained with reference to FIG. 3 and FIG. 4.

Figure 4:
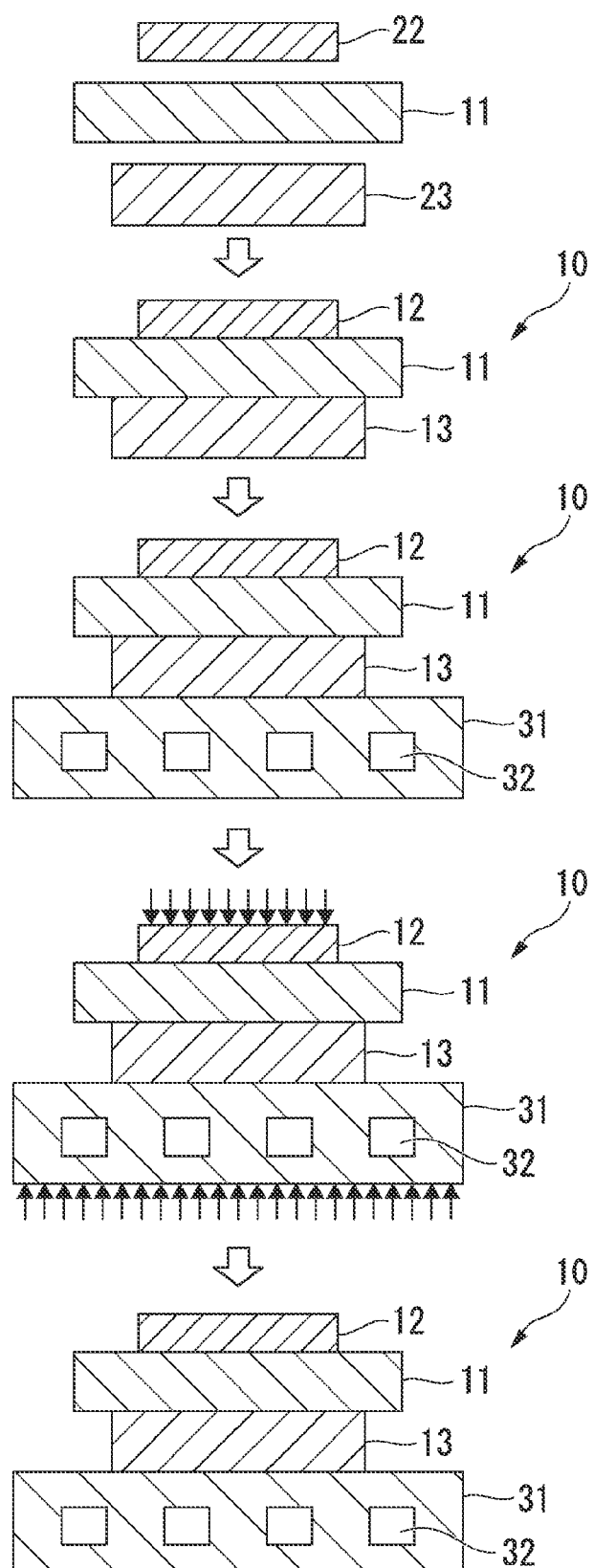
FIG. 4 shows a schematic explanatory diagram of a producing method of the power module substrate according to the first embodiment of the present invention.

First, as shown in FIG. 4, aluminum plates 22 and 23 are laminated on the first surface and second surface of the ceramic substrate 11 via a brazing material. Then, the ceramic substrate 11 and the aluminum plates 22 and 23 are bonded together by heating them while pressurizing and then cooling them, and the circuit layer 12 and the metal layer 13 are formed (circuit layer and metal layer bonding step S11). In addition, the brazing temperature is set to 640 to 650° C.

In the above manner, the power module substrate 10 in which the circuit layer 12 is formed on the first surface of the ceramic substrate 11 and the metal layer 13 is formed on the second surface thereof is obtained.

Next, as shown in FIG. 4, the heat sink 31 is laminated on the other side of the metal layer 13. Here, one side of the metal layer 13 is a surface of the metal layer 13 bonded to the second surface of the ceramic substrate 11. Also, the other side of the metal layer 13 is an opposite surface of the surface of the metal layer 13 bonded to the second surface of the ceramic substrate 11. In a state in which the metal layer 13 and the heat sink 31 are pressurized in a lamination direction, the metal layer 13 and heat sink 31 are bonded together by solid phase diffusion bonding with maintaining the heating temperature of the metal layer 13 and heat sink 31 to less than the eutectic temperature of aluminum and copper (heat sink bonding step S12). Specifically, one side of the power module 10 and the other side of the heat sink 31, that is, a lower surface of the heat sink 31 in FIG. 4, are pressurized, and they are placed in a vacuum furnace. In the present embodiment, the load pressurizing the contacting surface between the metal layer 13 and the heat sink 31 is set to be 3 to 35 kgf/cm$^2$. Also, the heating temperature of the vacuum heating is set to be less than the eutectic temperature of aluminum and copper, solid phase diffusion bonding is performed, and the metal layer 13 and the heat sink 31 are bonded together. The preferable conditions of this vacuum heating are to maintain to 400 to 548° C. for 15 to 270 minutes.

In the present embodiment, the surfaces of the metal layer 13 and the heat sink 31 which will be bonded together are formed to be smooth in advance by eliminating scratches thereon, and then, solid phase diffusion bonding is performed.

In addition, the more preferable heating temperature of the vacuum heating is in the range of −5° C. from the eutectic temperature of aluminum and copper to less than the eutectic temperature.

In the above manner, the heat-sink-attached-power module substrate 30 and the power module substrate 10 according to the present embodiment can be obtained.

The semiconductor device 3 is mounted on one side (the surface) of the circuit layer 12 via a solder material, and solder joint is carried out at inside a reduction furnace (semiconductor device bonding step S13).

In this manner, the heat-sink-attached-power module 1 according to the present embodiment is produced.

According to the heat-sink-attached-power module substrate 30 of the present embodiment having the above configuration, since the metal layer 13 composed of aluminum and the heat sink 31 composed of copper are bonded together by solid phase diffusion bonding, the thermal conductivity in the bonding portion of the metal layer 13 and heat sink 31 is improved and the thermal resistance therein can be reduced as compared with the case of bonding via a grease or solder having a bad thermal conductivity.

Furthermore, since the metal layer 13 and the heat sink 31 are bonded together by solid phase diffusion bonding and the intermetallic compound layer 41 formed of Cu and Al is formed in the bonding interface between the metal layer 13 and the heat sink 31, the interdiffusion of Al (aluminum atom) in the metal layer 13 and Cu (copper atom) in the heat sink 31 are sufficiently carried out, and the metal layer 13 and heat sink 31 are firmly bonded together.

In addition, since the intermetallic compound layer 41 has a structure in which the plurality of intermetallic compounds are laminated along the bonding interface, the intermetallic compounds 41, which are brittle, are prevented from growing large. Also, since the intermetallic compounds are formed in a layered form so as to be suitable for each composition from the metal layer 13 toward the heat sink 31 by the interdiffusion of Al in the metal layer 13 and Cu in the heat sink 31, the properties in the area in the vicinity of the bonding interface can be stable.

Specifically, since the intermetallic compound layer 41 is formed by laminating three types of the intermetallic compounds which are the θ phase 43, η2 phase 44, and ζ2 phase 45 and are laminated sequentially in the order of the θ phase 43, η2 phase 44, and ζ2 phase 45 from the metal layer 13 toward the heat sink 31, the volume change inside the intermetallic compound layer 41 becomes small, and an internal distortion thereof is suppressed.

That is, if solid diffusion does not occur, for example, if a liquid phase is formed, the intermetallic compounds are generated more than necessary and the volume change of the intermetallic compound layer becomes large, and thus, an internal distortion of the intermetallic compound layer occurs. However, if solid diffusion is occurred, the brittle intermetallic compound layer does not grow large and the intermetallic compounds are formed in a layered form, and therefore, the internal distortion thereof can be limited.

In addition, in the bonding interface between these intermetallic compound layer 41 and the heat sink 31, since the oxide 46 is dispersed in a layered form along the bonding interface, an oxide film formed on the surface of the metal layer 13 is reliably broken, the interdiffusion of Cu and Al has progressed sufficiently, and the metal layer 13 and the heat sink 31 are securely bonded together.

Moreover, since the average thickness of the intermetallic compound layer 41 is in the range of 1 μm to 80 μm and more preferably is in the range of 5 μm to 80 μm, the interdiffusion of Al in the metal layer 13 and Cu in the heat sink 31 is sufficiently carried out, the metal layer 13 and the heat sink 31 can be bonded together firmly, the intermetallic compounds layer 41, which is brittle as compared with the metal layer 13 and heat sink 31, is suppressed from growing more than necessary, and therefore, the properties of the bonding interface become stable.

Furthermore, in the present embodiment, the average crystal grain size of the heat sink 31 is in the range of 50 to 200 μm, the average crystal grain size of the metal layer 13 is 500 μm or more, and the average crystal grain sizes of the metal layer 13 and heat sink 31 are set relatively large. Therefore, unnecessary distortion is not accumulated in the metal layer 13 and heat sink 31, and good fatigue characteristics are achieved. Thus, in the heat cycle load, the bonding reliability with respect to the thermal stress generated between the power module substrate 10 and the heat sink 31 is improved.

Since the solid phase diffusion bonding is carried out in a state in which the metal layer 13 of the power module substrate 10 and the heat sink 31 are pressurized in the lamination direction, a gap is less likely to be generated in the bonding portion of the metal layer 13 and heat sink 31, and a good thermal conductivity of the bonding portion can be obtained.

Furthermore, since the solid phase diffusion bonding is carried out by maintaining the heating temperature of the metal layer 13 and heat sink 31 to less than the eutectic temperature of aluminum and copper, a liquid phase is not formed between the metal layer 13 and the heat sink 31. Therefore, a large amount of compounds of aluminum and copper is not generated between the metal layer 13 and the heat sink 31, and the bonding reliability of the bonding portion of the metal layer 13 and heat sink 31 can be improved.

Moreover, the circuit layer 12 and metal layer 13 composed of aluminum having a small deformation resistance are arranged on the first surface and second surface of the ceramic substrate 11, the thermal stress generated in the ceramic substrate 11 are absorbed by the circuit layer 12 and metal layer 13 when a heat cycle is performed, and therefore, the occurrence of cracks in the ceramic substrate 11 can be prevented.

In addition, since the heat sink 31 is composed of copper having a good thermal conductivity, heat dissipation properties of the heat-sink-attached-power module substrate 30 can be improved.

In the heat-sink-attached-power module 1 using the above-described heat-sink-attached-power module substrate 30, since the thermal resistance in the bonding portion of the metal layer 13 and heat sink 31 is small, the heat generated from the semiconductor device 3 can be efficiently dissipated. Furthermore, since the bonding strength between the metal layer 13 and the heat sink 31 is high, separation of the bonding interface is less likely to occur when a heat cycle is performed, and an increase of the thermal resistance of the heat-sink-attached-power module 1 can be suppressed. Also, since the heat sink 31 is composed of copper having an excellent thermal conductivity, the heat from the semiconductor device 3 can be further efficiently dissipated.

According to the heat-sink-attached-power module 1, since the heat generated from the semiconductor device 3 is efficiently dissipated as above and a temperature increase of the semiconductor device 3 can be suppressed, the semiconductor device 3 can be operated at a predetermined temperature, and the stability of the operation thereof can be improved.

Also, since the circuit layer 12 and metal layer 13 are composed of aluminum having a low deformation resistance, the occurrence of cracks in the ceramic substrate 11 is prevented, and the reliability of the heat-sink-attached-power module 1 can be improved.

In addition, solid phase diffusion bonding is configured by forming the circuit layer 12 on the first surface, forming the metal layer 13 on the second surface of the ceramic substrate 11, arranging the heat sink 31 on the other side of the metal layer 13, that is, the opposite surface of the surface of the metal layer 13 to which the second surface of the ceramic substrate 11 is bonded, and then, maintaining the temperature at 400 to 548° C. for 15 to 270 minutes in a state in which the metal layer 13 and heat sink 31 are pressurized with a load of 3 to 35 kgf/cm². In this manner, the metal layer 13 and heat sink 31 are bonded together by performing solid phase diffusion of copper atoms of the heat sink 31 into the metal layer 13 and by performing solid phase diffusion of aluminum atoms of the metal layer 13 into the heat sink 31 in a state in which the metal layer 13 is sufficiently in close contact with the heat sink 31, and thereby, the heat sink 31 can be reliably formed on the other side of the metal layer 13.

Furthermore, since the metal layer 13 and heat sink 31 can be bonded together with suppressing the generation of a gap between the metal layer 13 and the heat sink 31 by performing solid phase diffusion bonding in this manner, a good thermal conductivity in the bonding interface between the metal layer 13 and the heat sink 31 is obtained, the thermal resistance can be lowered, and the heat generated from the semiconductor device 3 can be effectively dissipated toward the heat sink 31 side.

In a case where a load pressurizing the metal layer 13 and the heat sink 31 is less than 3 kgf/cm² when solid phase diffusion bonding is performed, it is difficult to bond the metal layer 13 and the heat sink 31 together sufficiently, and it may cause a gap between the metal layer 13 and the heat sink 31. In addition, in a case where the load pressurizing them exceeds 35 kgf/cm², since the load pressurizing them is too high, cracks may occur to the ceramic substrate 11. According to such reasons, the load pressurizing them of when solid phase diffusion bonding is performed is set to the above range.

In a case where the temperature during performing solid phase diffusion bonding is less than 400° C., aluminum atoms and copper atoms do not diffuse sufficiently, and bonding by solid phase diffusion bonding becomes difficult. Also, in a case where the temperature exceeds 548° C., since a liquid phase is formed between the metal layer 13 and the heat sink 31 and a large amount of compounds of aluminum and copper is generated, the bonding of the metal layer 13 and heat sink 31 is inhibited and the bonding reliability is reduced. According to such reasons, the temperature when solid phase diffusion bonding is performed is set in the above range.

In addition, a preferable temperature for vacuum heating during performing solid phase diffusion bonding is in the range of −5° C. from the eutectic temperature of aluminum and copper or more to less than the eutectic temperature. When such temperature of vacuum heating is selected, a liquid phase is not formed in between the metal layer 13 and the heat sink 31, and therefore, compounds of aluminum and copper are not generated, a good bonding reliability of solid phase diffusion bonding is obtained. Furthermore, since the diffusion rate while performing solid phase diffusion bonding is fast and solid phase diffusion bonding can be performed in a relatively short time, the temperature is set as described above.

When a maintaining time of heating during performing solid phase diffusion bonding is less than 15 minutes, since the maintaining time is too short, a solid diffusion is hard to occur sufficiently and the bonding may become insufficient. When it exceeds 270 minutes, the production cost increases. Therefore, it is set in the above range.

In addition, in a case where there are scratches on the surface on which bonding will be performed when solid phase diffusion bonding is performed, a gap may occur when solid phase diffusion bonding is performed. However, since the scratches of the surfaces on which bonding of the metal layer 13 and heat sink 31 will be performed are removed and the surfaces are smoothed in advance, and after the above, since solid phase diffusion bonding is performed, the generation of gaps in each of the bonding interfaces is suppressed and bonding can be performed.

Second Embodiment

Next, a second embodiment of the present invention is explained.

Figure 5:
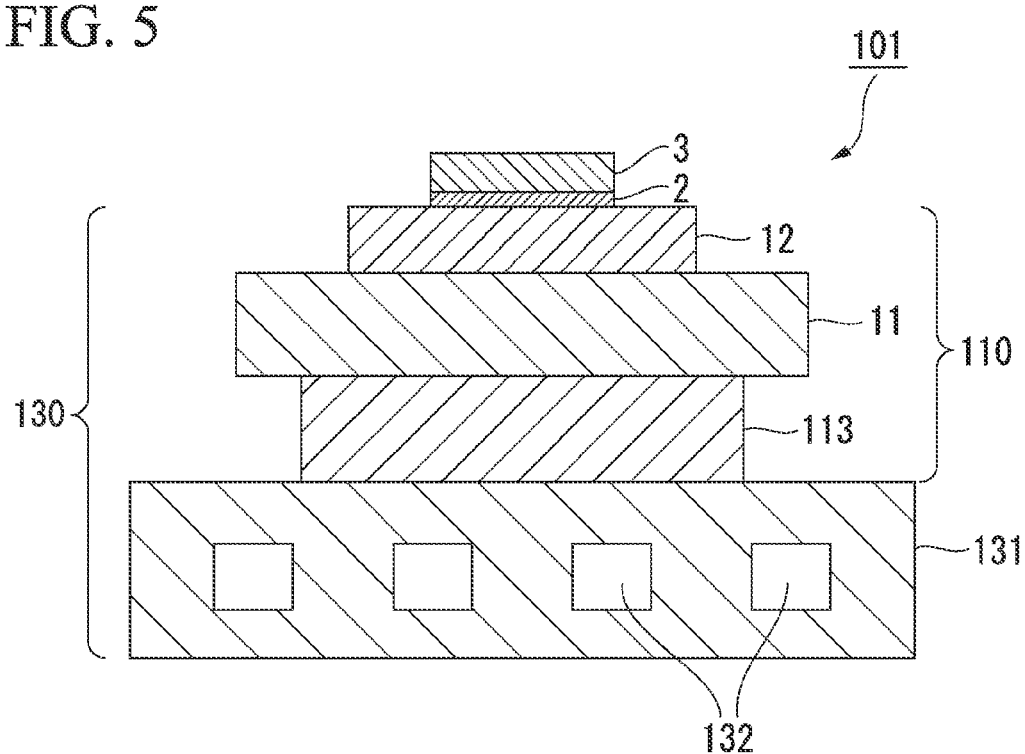
FIG. 5 shows a schematic explanatory diagram of a heat-sink-attached-power module, a heat-sink-attached-power module substrate, and a power module substrate according to a second embodiment of the present invention.

FIG. 5 shows a heat-sink-attached-power module 101, a heat-sink-attached-power module substrate 130, and a power module substrate 110 according to the second embodiment of the present invention. In addition, with respect to the same configurations as the first embodiment, the same reference numerals are used and the detail explanations thereof are omitted.

The heat-sink-attached-power module 101 includes the heat-sink-attached-power module substrate 130, and a semiconductor device 3 bonded to one side (upper side in FIG. 5) of the heat-sink-attached-power module substrate 130 via a solder layer 2.

The heat-sink-attached-power module substrate 130 includes the power module substrate 110 and a heat sink 131 bonded to the other side (lower side in FIG. 5) of the power module substrate 110.

As shown in FIG. 5, the power module substrate 110 includes: a ceramic substrate 11 (insulation layer), a circuit layer 12 formed on one surface (a first surface and upper surface in FIG. 5) of the ceramic substrate 11, and a metal layer 113 formed on the other surface (a second surface and lower surface in FIG. 5) of the ceramic substrate 11.

The metal layer 113 is formed by bonding a metal plate on the second surface (lower surface in FIG. 5) of the ceramic substrate 11. In the second embodiment, the metal layer 113 is composed of oxygen-free copper. The average crystal grain size of the metal layer 113 is in the range of 50 to 200 μm.

The heat sink 131 is composed of an aluminum alloy (A6063) and a flow path 132 through which a fluid for cooling flows is provided inside the heat sink 131. In the second embodiment, the average crystal grain size of the heat sink 131 is 500 μm or more.

Also, the metal layer 113 of the power module substrate 110 and the heat sink 131 are bonded together by solid phase diffusion bonding.

Figure 6:
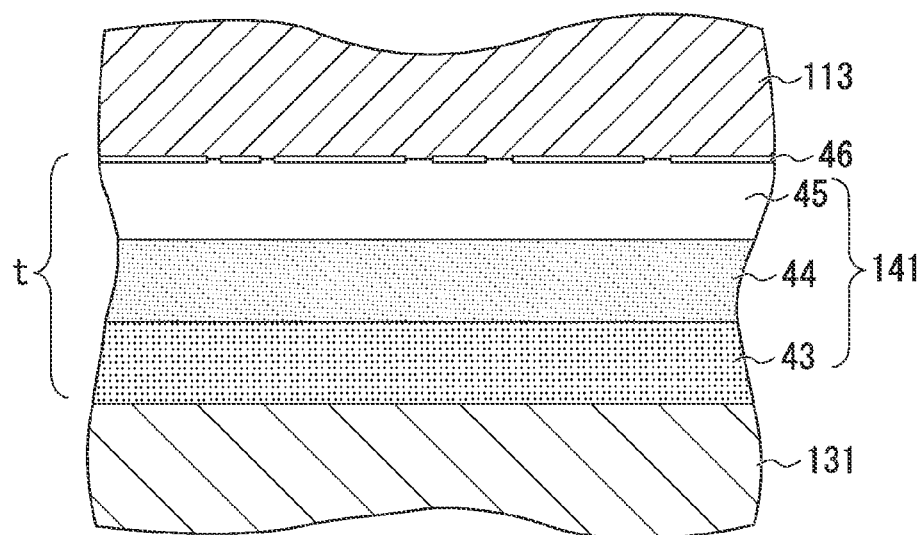
FIG. 6 shows an enlarged view of a bonding portion of a metal layer and heat sink in FIG. 5.

As shown in FIG. 6, an intermetallic compound layer 141 is formed in a bonding interface between the metal layer 113 and the heat sink 131.

The intermetallic compound layer 141 is formed by the interdiffusion of Cu (copper atom) of the metal layer 113 and Al (aluminum atom) of the heat sink 131. This intermetallic compound layer 141 has a concentration gradient in which the concentration of aluminum lowers gradually and the concentration of copper increases gradually toward the metal layer 113 from the heat sink 131.

The intermetallic compound layer 141 is formed of intermetallic compounds formed of Al and Cu, and in the second embodiment, it has a structure in which a plurality of intermetallic compounds are laminated along the bonding interface. Here, the thickness t of intermetallic compound layer 141 is set to be in the range of 1 to 80 μm, and preferably be in the range of 5 to 80 μm.

In the second embodiment, as shown in FIG. 6, it has a structure in which three types of the intermetallic compounds are laminated, and the structure thereof is formed so that a θ phase 43, a η2 phase 44, and a ζ2 phase 45 are arranged sequentially from the heat sink 131 toward the metal layer 113.

In the bonding interface between the intermetallic compound layer 141 and the metal layer 113, an oxide 46 is dispersed in a layered form along the bonding interface. In addition, in the second embodiment, the oxide 46 is an aluminum oxide such as alumina ($Al_2O_3$). In addition, the oxide 46 is dispersed in a state of being divided in the interface between the intermetallic compound layer 141 and the metal layer 113, and the intermetallic compound layer 141 and the metal layer 113 are directly in contact in some regions.

Next, a producing method of the heat-sink-attached-power module 101, the heat-sink-attached-power module substrate 130, and the power module substrate 110 according to the present embodiment will be explained.

Firstly, a copper plate served as the metal layer 113 is bonded to one surface (the second surface) of the ceramic substrate 11, and an Al plate served as the circuit layer 12 is bonded to the other surface (the first surface) of the ceramic substrate 11. In the present embodiment, oxygen-free copper is used as the copper plate, 4N aluminum is used as the Al plate, the bonding of the ceramic substrate and copper plate were performed by an active-metal brazing method, and the bonding of the ceramic substrate and Al plate were performed by a bonding using an Al—Si based brazing filler metal.

Next, the heat sink 131 is laminated on the other side of the metal layer 113, that is, the opposite surface of the surface of the metal layer 113 to which the second surface of the ceramic substrate 11 is bonded. Then, the heating temperature of the metal layer 113 and heat sink 131 is maintained to less than the eutectic temperature of aluminum and copper in a state in which the metal layer 113 and heat sink 131 are pressurized in a lamination direction, thereby the metal layer 113 and the heat sink 131 are bonded together by solid phase diffusion bonding. The conditions of the solid phase diffusion bonding are the same as the first embodiment.

In the above manner, the heat-sink-attached-power module substrate 130 and the power module substrate 110 according to the second embodiment can be obtained.

The semiconductor device 3 is mounted on one side (the surface) of the circuit layer 12 via a solder material, and solder joint is carried out at inside of a reduction furnace.

In this manner, the heat-sink-attached-power module 101 according to the second embodiment of the present invention is produced.

According to the heat-sink-attached-power module substrate 130 of the second embodiment having the above configuration, since the metal layer 113 composed of copper and the heat sink 131 composed of an aluminum alloy (A6063) are bonded together by solid phase diffusion bonding, the thermal conductivity in the bonding portion of the metal layer 113 and heat sink 131 is improved and the thermal resistance therein can be reduced as compared with the case of bonding via a grease or solder having bad thermal conductivity.

Furthermore, since the metal layer 113 and the heat sink 131 are bonded together by solid phase diffusion bonding and the intermetallic compound layer 141 formed of Cu and Al is formed in the bonding interface between the metal layer 113 and the heat sink 131, the interdiffusion of Cu (copper atom) in the metal layer 113 and Al (aluminum atom) in the heat sink 131 are sufficiently carried out, and the metal layer 113 and heat sink 131 are firmly bonded together.

In addition, in the bonding interface between these intermetallic compound layer 141 and the metal layer 113, since the oxide 46 is dispersed in a layered form along the bonding interface, an oxide film formed on the surface of the heat sink 131 is reliably broken, the interdiffusion of Cu and Al has progressed sufficiently, and the metal layer 113 and the heat sink 131 are reliably bonded together.

Moreover, since the average thickness of the intermetallic compound layer 141 is in the range of 1 μm to 80 μm, and more preferably is in the range of 5 μm to 80 μm, the interdiffusion of Cu in the metal layer 113 and Al in the heat sink 131 is sufficiently carried out, the metal layer 113 and the heat sink 131 can be bonded together firmly, the intermetallic compounds layer 141, which is brittle as compared with the metal layer 113 and heat sink 131, is suppressed from growing more than necessary, and therefore, the properties of the bonding interface become stable.

Furthermore, in the second embodiment, the average crystal grain size of the heat sink 131 is 500 μm or more, the average crystal grain size of the metal layer 113 is in the range of 50 to 200 μm, and the average crystal grain sizes of the metal layer 113 and heat sink 131 are set relatively large. Therefore, an unnecessary distortion is not accumulated in the metal layer 113 and heat sink 131, and good fatigue characteristics are achieved. Thus, in the heat cycle load, the bonding reliability with respect to the thermal stress generated between the power module substrate 110 and the heat sink 131 is improved.

Additionally, in the second embodiment, since the metal layer 113 is composed of oxygen-free copper, the heat from the semiconductor device 3 is spread, is efficiently transferred to the heat sink 131 side, and thus, the thermal resistance can be lowered.

The embodiments of the present invention has been explained as above; however, the present invention is not limited thereto and can be appropriately changed without departing from the technical concept of the present invention.

In addition, the above embodiments have been explained the case in which the circuit layer is composed of 4N aluminum having a purity of 99.99%; however, it is not limited thereto, and it can be configured of 2N aluminum having a purity of 99%, an aluminum alloy, copper or a copper alloy. In a case where the circuit layer is formed of copper or a copper alloy, the heat from the semiconductor device is spread in a planar direction in the circuit layer, and the heat can be efficiently dissipated toward the power module substrate side.

Also, the above embodiments have been explained the case in which the metal layer is composed of pure aluminum having a purity of 99.99%; however, it may be configured of aluminum having a purity of 99% (2N aluminum) or an aluminum alloy. Also, the embodiments have been explained the case in which the heat sink is composed of an aluminum alloy (A6063); however, it may be composed of pure aluminum having a purity of 99.99% or other aluminum alloys.

In addition, the embodiments have been explained the case in which the metal layer or the heat sink is composed of an oxygen-free copper; however, it may be configured of a tough pitch copper or a copper alloy. Also, the embodiments have been explained the case in which a flow path is provided inside the heat sink; however the flow path is not necessarily provided. Also, the heat sink may be provided with heat radiation fins.

For example, in a case where the metal layer is composed of an aluminum alloy and the heat sink is composed of a copper alloy, the heating temperature when solid phase diffusion bonding is performed will be less than the eutectic temperature of the aluminum alloy and copper alloy, and will be less than the eutectic temperature of a metal composing the metal layer and a metal composing the heat sink.

Furthermore, the embodiment has been explained such that the ceramic substrate made of AlN is used as an insulation layer. However, it is not limited thereto, and a ceramic substrate composed of $Si_3N_4$, $Al_2O_3$ or the like may be used and an insulating resin may be used as an insulation layer.

Figure 7:
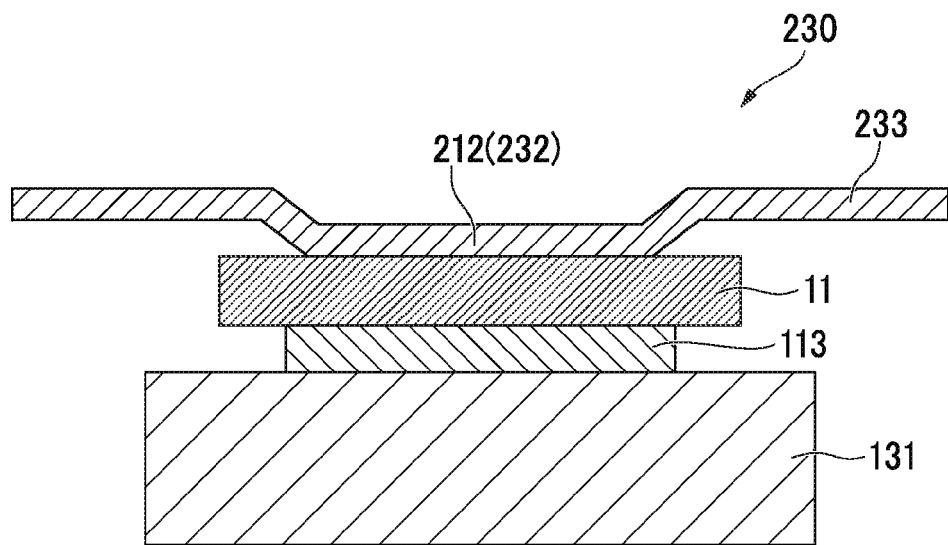
FIG. 7 shows a schematic explanatory diagram of a producing method of a heat-sink-attached-power module substrate according to another embodiment of the present invention.

In the heat-sink-attached-power module substrate of the above embodiments, the case in which an aluminum plate is bonded to the first surface of the ceramic substrate to form a circuit layer has been explained. However, for example, as shown in the heat-sink-attached-power module substrate 230 in FIG. 7, a die pad 232 to which a semiconductor device or the like is bonded an which is used as a circuit layer 212 and a copper plate having a lead portion 233 used as an external terminal may be bonded to the first surface of the ceramic substrate 11. Here, as a method to bond the ceramic substrate 11 and the above-described copper plate together, for example, an active-metal brazing method, DBC method or the like can be used. In the heat-sink-attached-power module substrate 230 shown in FIG. 7, the die pad 232 and the ceramic substrate 11 are bonded together.

Figure 8:
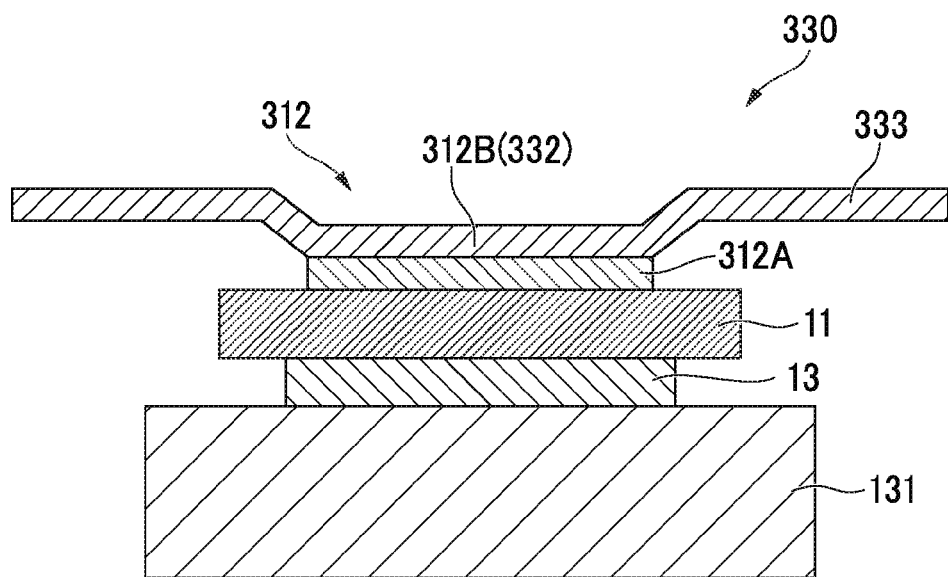
FIG. 8 shows a schematic explanatory diagram of a producing method of a heat-sink-attached-power module substrate according to still another embodiment of the present invention.

Also, as shown in a heat-sink-attached-power module substrate 330 shown in FIG. 8, it may be configured so that a circuit layer 312 includes an aluminum layer 312A and a copper layer 312B bonded on one side of the aluminum layer 312A, and the copper layer 312B is composed of a copper plate having a die pad 332 and a lead portion 333. In the heat-sink-attached-power module substrate 330, the aluminum layer 312A and the die pad 332 are bonded together by solid phase diffusion bonding. One side of the aluminum layer 312A is the opposite surface of a surface of the aluminum layer 312A to which the first surface of the ceramic substrate 11 is bonded.

The thickness of the aluminum layer 312A is preferably set to be in the range of 0.1 to 1.0 mm. Also, the thickness of the copper layer 312B is preferably set to be in the range of 0.1 to 6.0 mm.

The first embodiment has been explained such that the intermetallic compound layer 41 is formed in the bonding interface between the metal layer 13 and the heat sink 31, and the intermetallic compound layer 41 is configured so that the θ phase 43, the η2 phase 44, and the ζ2 phase 45 are sequentially laminated from the metal layer 13 toward the heat sink 31; however, the embodiment is not limited thereto.

Figure 9:
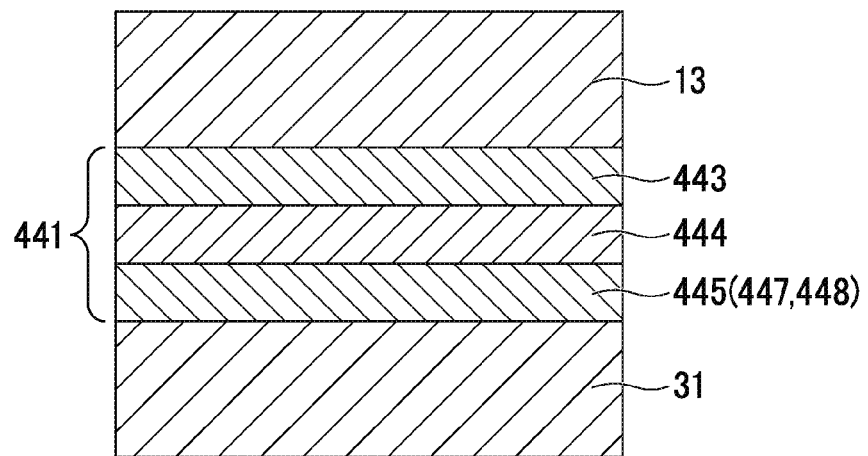
FIG. 9 shows a schematic explanatory diagram of a bonding interface between a metal layer and a heat sink in a heat-sink-attached-power module substrate according to yet another embodiment of the present invention.

Specifically, in the bonding interface between the metal layer 13 and the heat sink 31, a plurality of intermetallic compounds formed of Cu and Al may be laminated so that aluminum ratio is lowered gradually from the metal layer 13 toward the heat sink 31. Also, as shown in FIG. 9, in the bonding interface between the metal layer 13 and the heat sink 31, a θ phase 443, a η2 phase 444, and furthermore at least one phase from a ζ2 phase 445, an δ phase 447, and a γ2 phase 448 may be laminated sequentially from the metal layer 13 toward the heat sink 31 along the above-described bonding interface (see FIG. 13).

Figure 10:
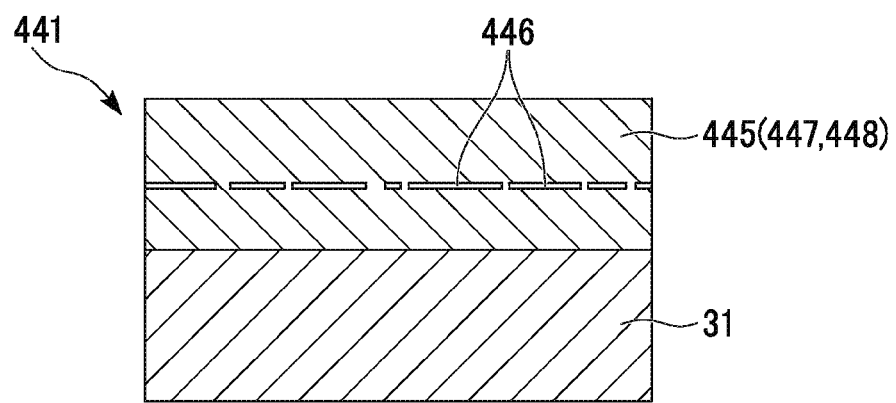
FIG. 10 is an enlarged explanatory view of an interface between the heat sink and an intermetallic compound layer in FIG. 9.

The first embodiment has been explained such that the oxide 46 is dispersed in a layered form along the bonding interface between the intermetallic compound layer 41 and the heat sink 31. However, for example as shown in FIG. 10, along the interface between an intermetallic compound layer 441 and a heat sink 31, it may be configured so that an oxide 446 is dispersed in a layered form inside a layer configured of at least one phase from the ζ2 phase 445, the δ phase 447, and the γ2 phase 448. In addition, this oxide 446 is an aluminum oxide such as alumina ($Al_2O_3$).

The second embodiment has been explained such that the intermetallic compound layer 141 is formed in the bonding interface between the metal layer 113 and the heat sink 131, and the intermetallic compound layer 141 is configured so that the θ phase 43, the η2 phase 44, and the ζ2 phase 45 are sequentially laminated from the metal layer 113 toward the heat sink 131; however, the embodiment is not limited thereto.

Figure 11:
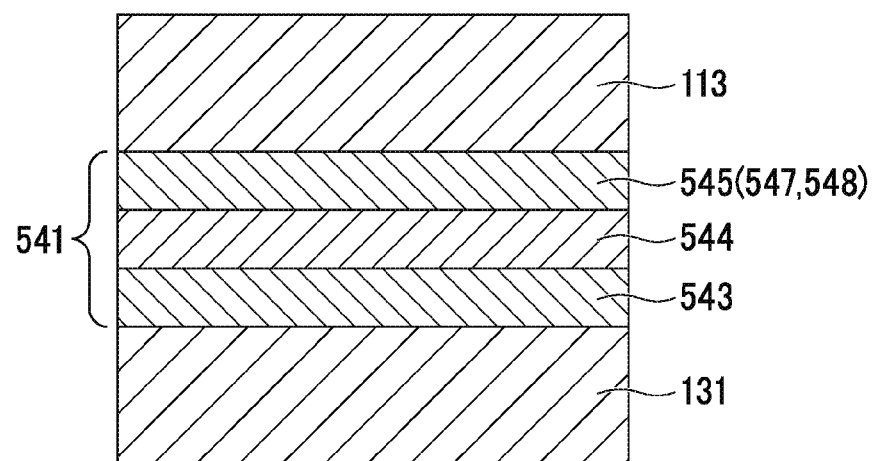
FIG. 11 shows a schematic explanatory diagram of a bonding interface between a metal layer and a heat sink in a heat-sink-attached-power module substrate according to yet another embodiment of the present invention.

Specifically, in the bonding interface between the metal layer 113 and the heat sink 131, intermetallic compounds formed of a plurality of Cu and Al may be laminated so that aluminum ratio is lowered gradually from the heat sink 131 toward metal layer 113. Also, as shown in FIG. 11, in the bonding interface between the metal layer 113 and the heat sink 131, a θ phase 543, a η2 phase 544, and furthermore at least one phase from a ζ2 phase 545, an δ phase 547, and a γ2 phase 548 may be laminated sequentially from the heat sink 131 toward the metal layer 113 along the above-described bonding interface.

Figure 12:
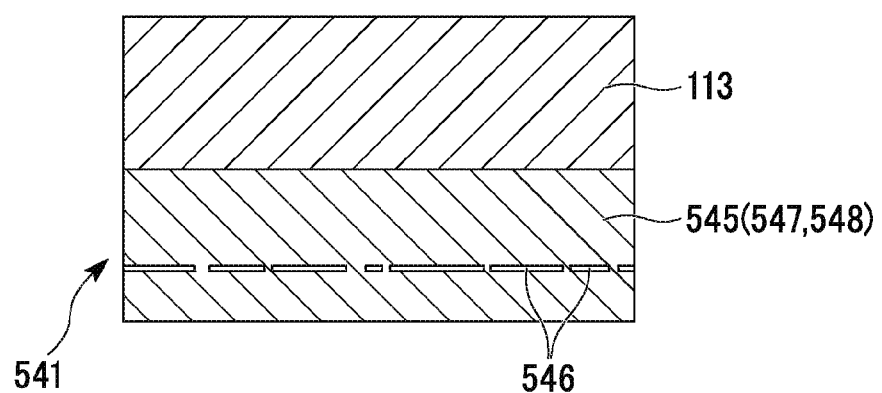
FIG. 12 is an enlarged explanatory view of an interface between the metal layer and an intermetallic compound layer in FIG. 11.

The second embodiment has been explained such that the oxide 46 is dispersed in a layered form along the bonding interface between the intermetallic compound layer 141 and the metal layer 113. However, for example as shown in FIG. 12, along the interface between an intermetallic compound layer 541 and the metal layer 113, it may be configured so that an oxide 546 is dispersed in a layered form inside a layer configured of at least one phase from the ζ2 phase 545, the δ phase 547, and the γ2 phase 548. In addition, this oxide 546 is an aluminum oxide such as alumina ($Al_2O_3$).

Examples

Hereinafter, the results of the confirmation experiment which was performed to confirm the effects of the present invention are explained.

Figure 3:
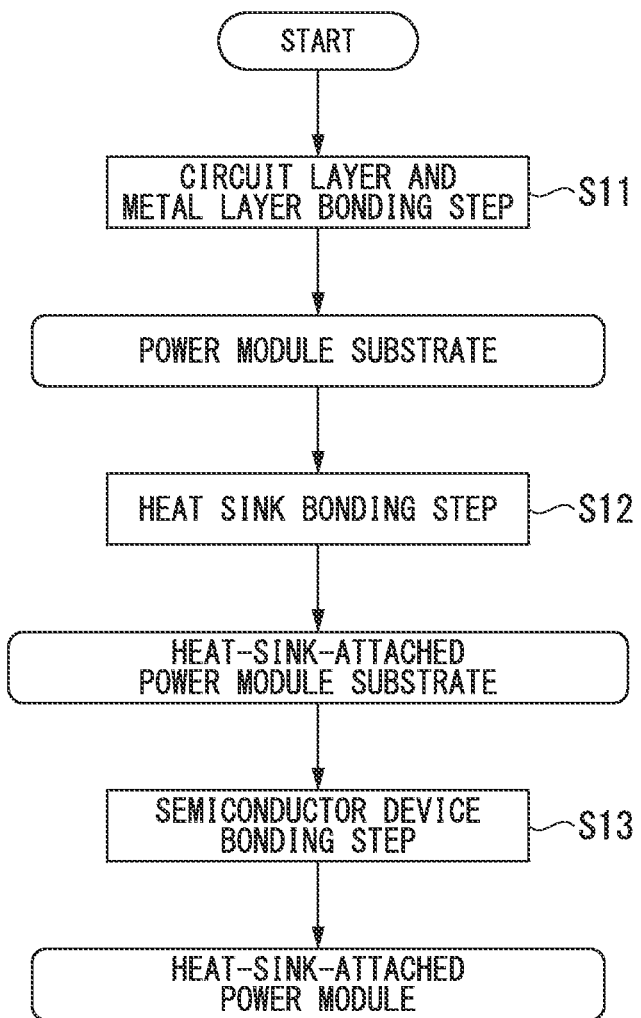
FIG. 3 shows a flow chart of explaining a producing method of the heat-sink-attached-power module according to the first embodiment of the present invention.

According to the steps described in the flow chart in FIG. 3, heat-sink-attached-power modules of Examples 1-1 to 1-7 of the present invention, Examples 2-1 to 2-7 of the present invention, Comparative Example 1 and Comparative Example 2 were produced using a heat-sink-attached-power module substrate in which a metal layer and heat sink are bonded together under the conditions shown in Table 1 and Table 2.

In addition, the ceramic substrate was composed of AlN, and the substrate having a size of 40 mm×40 mm and having a thickness of 0.635 mm was used.

The circuit layer was made of a rolled sheet of 4N aluminum, and the circuit layer having a size of 37 mm×37 mm and having a thickness of 0.6 mm was used.

With respect to the Examples 1-1 to 1-7 of the present invention and Comparative Example 1, the metal layer was made of a rolled sheet of 4N aluminum, and the metal layer having a size of 37 mm×37 mm and having a thickness of 1.6 mm was used.

With respect to the Examples 2-1 to 2-7 of the present invention and Comparative Example 2, the metal layer was made of a rolled sheet of oxygen-free copper, and the metal layer having a size of 37 mm×37 mm and having a thickness of 0.3 mm was used.

With respect to the Examples 1-1 to 1-7 of the present invention and Comparative Example 1, the heat sink was made of oxygen-free copper, and the heat sink having a flow path used for cooling therein was used.

With respect to the Examples 2-1 to 2-7 of the present invention and Comparative Example 2, the heat sink was made of an aluminum alloy (A6063), and the heat sink having a flow path used for cooling therein was used.

The semiconductor device was IGBT device, and the semiconductor device having a size of 12.5 mm×9.5 mm and having a thickness of 0.25 mm was used.

The following evaluation was carried out to the heat-sink-attached-power modules produced as above.

<Heat Cycle Test>

Heat cycle test was carried out by performing heat cycles of −40° C. to 125° C. In the present example, 3000 cycles of the heat cycle were performed.

A bonding rate of the interface between the metal layer and the heat sink and a thermal resistance of the heat-sink-attached-power module were measured in before and after the heat cycle test.

<Evaluation Method of Oxide>

Each of the cross-sectional surfaces, which were ion etched with conditions of the ion accelerating voltage: 5 kV; the processing time: 14 hours; and the projection amount from a masking shield: 100 μm by using the cross-section polisher (SM-09010 produced by JEOL Ltd.), was photographed to obtain an In-Lens image and compositional image and was analyzed by EDS analysis by using a Scanning electron microscope (ULTRA55 produced by Carl Zeiss NTS GmbH) with an accelerating voltage: 1 kV; and a WD: 2.5 mm.

With respect to the Examples 1-1 to 1-7 and 2-1 to 2-7 of the present invention, when the In-Lens image was photographed, a white contrast portion which disperses in a layered form along the bonding interface between Cu and an intermetallic compound layer was observed. When a compositional image was photographed in the same conditions, the white contrast portion had a darker contrast than Al. Furthermore, oxygen had been enrichment at the same portion according to EDS analysis. According to the above, it was confirmed that in the interface between Cu and the intermetallic compound layer, oxide is dispersed in a layered form along the interface.

Also, the above oxide was not observed in the Comparative Example 1 and Comparative Example 2. The sample in which oxide can be confirmed from the above method was recorded as "Present" in Tables, and the sample in which oxide cannot be confirmed was recorded as "None" therein.

<Evaluation of Bonding Rate of Bonding Interface Between Metal Layer and Heat Sink>

With respect to the heat-sink-attached-power module before and after the heat cycle test, the bonding rate of the bonding interface between the metal layer and the heat sink was evaluated using an ultrasonic flaw detection device, and the bonding rate was calculated from the calculating formula shown below. Here, the initial bonding area is a target area of bonding at the time before the bonding, that is, the area of the metal layer. Since the peeled off part is indicated by a white color part in an ultrasonic flaw detection image, the area of the white color part is set as a peeled off area.

(Bonding rate (%))={(Initial bonding area)−(Peeled off area)}/(Initial bonding area)×100

<Evaluation of the Thermal Resistance>

The thermal resistance was measured as follows. A heater chip as a semiconductor device was heated by power of 100 W, and the temperature of the heater chip was measured using a thermocouple. In addition, the temperature of a cooling medium (ethylene glycol:water=9:1) flowing through the heat sink was measured. A value in which the temperature difference between the heat chip and the cooling medium is divided by power was defined as the thermal resistance.

The evaluation results of the Examples 1-1 to 1-7 of the present invention in which the metal layer is 4N aluminum and the heat sink is an oxygen-free copper, and the Comparative Example 1 are shown in Table 1.

The evaluation results of the Examples 2-1 to 2-7 of the present invention in which the metal layer is oxygen-free copper and the heat sink is an aluminum alloy (A6063), and the Comparative Example 2 are shown in Table 2.

As shown in Tables 1 and 2, in the Comparative Examples 1 and 2 which have no oxide dispersing in a layered form along the interface between Cu and the intermetallic compound layer, the bonding rate before the heat cycle was high, but the bonding rate after the heat cycle was reduced and the thermal resistance increased. This can be assumed by reason that the temperature when solid phase diffusion bonding is performed was greater than or equal to the eutectic temperature of aluminum and copper.

On the other hand, in the Examples 1-1 to 1-7 and 2-1 to 2-7 of the present invention, since oxide dispersing in a layered form along the interface between Cu and intermetallic compound layer is present, the bonding rate before the heat cycle and the bonding rate after the heat cycle test were high, and furthermore, the thermal resistance before the heat cycle test and the thermal resistance after the heat cycle test were small.

Accordingly, in the Examples 1-1 to 1-7 and 2-1 to 2-7 of the present invention, it was confirmed that the power module substrate and heat sink are firmly bonded together.

FIELD OF INDUSTRIAL APPLICATION

The present invention can provide: a heat-sink-attached-power module substrate in which the thermal resistance in the bonding portion of the metal layer and heat sink is reduced and the temperature increase of the electronic components can be suppressed, in a case where either one of a metal layer and heat sink, which will be bonded together, is composed of aluminum or an aluminum alloy and the other one of them is composed of copper or a copper alloy; a heat-sink-attached-power module; and a producing method of the heat-sink-attached-power module substrate.

TABLE 1

|  | Conditions of solid phase diffusion bonding | | | Oxide dispersed in a layered form | Before heat cycle test | | After heat cycle test | |
| --- | --- | --- | --- | --- | --- | --- | --- | --- |
|  | Load kgf/cm² | Temperature ° C. | Time minute |  | Thermal resistance ° C./W | Bonding rate % | Thermal resistance ° C./W | Bonding rate % |
| Example 1-1 of Present invention | 3 | 480 | 120 | Present | 0.350 | 97.6 | 0.361 | 94.4 |
| Example 1-2 of Present invention | 35 | 480 | 120 | Present | 0.350 | 100 | 0.354 | 98 |
| Example 1-3 of Present invention | 9 | 400 | 180 | Present | 0.355 | 97.5 | 0.368 | 91.2 |
| Example 1-4 of Present invention | 9 | 540 | 180 | Present | 0.350 | 100 | 0.360 | 95.2 |
| Example 1-5 of Present invention | 24 | 540 | 15 | Present | 0.350 | 100 | 0.361 | 94.5 |
| Example 1-6 of Present invention | 24 | 540 | 270 | Present | 0.350 | 100 | 0.360 | 94.8 |
| Example 1-7 of Present invention | 10 | 540 | 30 | Present | 0.354 | 98.1 | 0.354 | 97.8 |
| Comparative Example 1 | 10 | 560 | 30 | None | 0.350 | 100 | 0.398 | 75.8 |

TABLE 2

|  | Conditions of solid phase diffusion bonding | | | Oxide dispersed in a layered form | Before heat cycle test | | After heat cycle test | |
| --- | --- | --- | --- | --- | --- | --- | --- | --- |
|  | Load kgf/cm² | Temperature ° C. | Time minute |  | Thermal resistance ° C./W | Bonding rate % | Thermal resistance ° C./W | Bonding rate % |
| Example 2-1 of Present invention | 3 | 480 | 90 | Present | 0.301 | 99.6 | 0.310 | 95.2 |
| Example 2-2 of Present invention | 35 | 480 | 90 | Present | 0.300 | 100 | 0.305 | 97.6 |
| Example 2-3 of Present invention | 15 | 400 | 180 | Present | 0.300 | 100 | 0.313 | 93.7 |
| Example 2-4 of Present invention | 15 | 540 | 180 | Present | 0.300 | 100 | 0.310 | 94.9 |
| Example 2-5 of Present invention | 27 | 540 | 15 | Present | 0.300 | 100 | 0.314 | 92.8 |
| Example 2-6 of Present invention | 27 | 540 | 270 | Present | 0.300 | 100 | 0.303 | 98.6 |
| Example 2-7 of Present invention | 12 | 540 | 30 | Present | 0.300 | 100 | 0.303 | 98.4 |
| Comparative Example 2 | 5 | 560 | 30 | None | 0.302 | 98.9 | 0.375 | 62.3 |

DESCRIPTION OF REFERENCE SIGNS

1, 101: Heat-sink-attached-power module
3: Semiconductor device
10, 110: Power module substrate 11: Ceramic substrate
12, 212, 312: Circuit layer
13, 113: Metal layer
30, 130, 230, 330: Heat-sink-attached-power module substrate
31, 131: Heat sink
41, 141, 441, 541: Intermetallic compound layer

What is claimed is:

1. A heat-sink-attached-power module substrate which includes a power module substrate in which a circuit layer is arranged on one surface of an insulation layer and a metal layer is arranged on the other surface of the insulation layer, and a heat sink bonded on the metal layer of the power module substrate,
  wherein either one of the metal layer and the heat sink is an aluminum member composed of aluminum or an aluminum alloy,
  and the other one of them is a copper member composed of copper or a copper alloy,
  the metal layer and the heat sink are bonded together by solid phase diffusion bonding,
  an intermetallic compound layer of copper and aluminum is formed by solid phase diffusion in a bonding interface between the metal layer and the heat sink, and has a structure in which a plurality of intermetallic compounds are formed in a layered form and laminated along the bonding interface, and
  an oxide is dispersed in an interface between the intermetallic compound layer and either one of the metal layer composed of copper or a copper alloy and heat sink composed of copper or a copper alloy in a layered form along the interface,
  wherein the intermetallic compound layer has a structure in which a θ phase, a η2 phase, and at least one phase selected from the group consisting of a ζ2 phase, a δ phase, and a γ2 phase are laminated sequentially from the aluminum member toward the copper member.

2. A heat-sink-attached-power module comprises:
  the heat-sink-attached-power module substrate according to claim 1, and
  a semiconductor device bonded to one side of the circuit layer.

3. The heat-sink-attached-power module substrate according to claim 1, wherein a thickness of the intermetallic compound layer is in the range of 1 to 80 μm.

4. The heat-sink-attached-power module substrate according to claim 3, wherein a thickness of the intermetallic compound layer is in the range of 5 to 80 μm.

5. The heat-sink-attached-power module substrate according to claim 1, wherein the oxide is dispersed in a layered form inside a layer configured of at least one phase selected from the group consisting of the ζ2 phase, the δ phase, and the γ2 phase.

6. The heat-sink-attached-power module substrate according to claim 1, wherein an average crystal grain size of the aluminum member is 500 μm or more.

7. The heat-sink-attached-power module substrate according to claim 1, wherein an average crystal grain size of the copper member is in the range of 50 to 200 μm.

8. A producing method of a heat-sink-attached-power module substrate which includes a power module substrate in which a circuit layer is arranged on one surface of an insulation layer and a metal layer is arranged on the other surface of the insulation layer, and a heat sink bonded on the metal layer of the power module substrate, the producing method comprising the steps of:
  preparing either one of the metal layer and the heat sink of an aluminum member composed of aluminum or an aluminum alloy, and preparing the other one of them of a copper member composed of copper or a copper alloy,
  laminating the metal layer and the heatsink,
  bonding the metal layer and the heat sink together by solid phase diffusion bonding by pressing the metal layer and the heatsink in a lamination direction with a load of 3 to 35 kgf/cm2 while a heating temperature of the metal layer and the heat sink is maintained to less than the eutectic temperature of aluminum and copper,
  forming an intermetallic compound layer of copper and aluminum in a bonding interface between the metal layer and the heat sink, the intermetallic compound layer having a structure in which a plurality of intermetallic compounds are formed in a layered form and laminated along the bonding interface, and
  dispersing an oxide in an interface between the intermetallic compound layer and either one of the metal layer composed of copper or a copper alloy and heat sink composed of copper or a copper alloy in a layered form along the interface,
  wherein the intermetallic compound layer has a structure in which a θ phase, a η2 phase, and at least one phase selected from the group consisting of a ζ2 phase, a δ phase, and a γ2 phase are laminated sequentially from the aluminum member toward the copper member.

* * * * *